United States Patent [19]

Suzuki et al.

[11] Patent Number: 5,604,393
[45] Date of Patent: Feb. 18, 1997

[54] SURFACE ACOUSTIC WAVE DEVICE

[75] Inventors: Yoshihisa Suzuki; Toshiyasu Fujiwara; Katsuo Sato, all of Chiba, Japan

[73] Assignee: TDK Corporation, Tokyo, Japan

[21] Appl. No.: 405,008

[22] Filed: Mar. 16, 1995

[30] Foreign Application Priority Data

Aug. 12, 1994 [JP] Japan .................................. 6-211796

[51] Int. Cl.$^6$ ............................................. H01L 41/08
[52] U.S. Cl. ............................ 310/313 D; 310/313 R; 333/193
[58] Field of Search ........................ 310/313 R, 313 A, 310/313 D; 333/150, 151, 193, 194

[56]  References Cited

U.S. PATENT DOCUMENTS

| | | | |
|---|---|---|---|
| 4,954,793 | 9/1990 | Misu et al. ............................... | 333/193 |
| 5,202,652 | 4/1993 | Tabuchi et al. ......................... | 333/193 |
| 5,486,800 | 1/1996 | Davenport ........................ | 310/313 R X |

*Primary Examiner*—Mary O. Budd
*Attorney, Agent, or Firm*—Oblon, Spivak, McClelland, Maier & Neustadt, P.C.

[57]  ABSTRACT

A surface acoustic wave (SAW) device includes a plurality of SAW filters connected in cascade. An impedance matching element in the form of a SAW resonator is interposed between two adjoining SAW filters. Each filter includes a first piezoelectric substrate having a first electromechanical coupling factor and the resonator includes a second piezoelectric substrate having a second electromechanical coupling factor. The second electromechanical coupling factor is greater than the first factor so that the inductive band of the SAW resonator is wider than the pass band of the SAW filter. The device affords improved filter properties including an increased fractional bandwidth and an increased out-of-band attenuation.

5 Claims, 20 Drawing Sheets

,604,393

SURFACE ACOUSTIC WAVE DEVICE

TECHNICAL FIELD

This invention relates to a surface acoustic wave device and more particularly, to a surface acoustic wave device comprising a plurality of surface acoustic wave filters connected in cascade, with an impedance matching element interposed between two adjoining surface acoustic wave filters.

BACKGROUND

In the mobile radio communication field which is markedly spreading in these years, for example, a frequency band of 70 to 400 MHz is employed as the intermediate frequency of communication equipment. Bandpass filters known in the prior art for use in such a frequency band of more than 50 MHz include LC filters, monolithic quartz crystal filters (sometimes abbreviated as MCF) utilizing piezoelectric bulk wave, and surface acoustic wave (sometimes abbreviated as SAW) filters. Among others, multi-mode type surface acoustic wave filters are often used in the recent years.

The multi-mode type surface acoustic wave filters operate on a principle which is very similar to the well-known operating principle of MCF. The filter includes a plurality of juxtaposed resonators each including a piezoelectric substrate and an interdigital transducer (abbreviated as IDT, hereinafter) formed thereon wherein excitation of dominant and higher modes occurs by acoustic coupling. A pattern design is made such that the anti-resonance frequency of the dominant mode may coincide with the resonance frequency of the higher modes.

The multi-mode type surface acoustic wave filters include transversely coupled multi-mode filters and longitudinally coupled multi-mode filters. The transversely coupled multi-mode filters utilize a displacement distribution of a primary mode (referred to as a symmetric mode, hereinafter) and a secondary mode (referred to as an antisymmetric mode, hereinafter) existing in a direction perpendicular to the propagation direction or transverse direction as shown in FIG. 1(a). The longitudinally coupled multi-mode filters utilize a displacement distribution of a symmetric mode and an antisymmetric mode existing in the propagation direction or longitudinal direction as shown in FIG. 1(b). Usually a plurality of such multi-mode type surface acoustic wave filters are connected in cascade in order to improve an out-of-band attenuation. In general, both transversely and longitudinally coupled multi-mode filters include reflectors at opposite sides of the element for the purpose of increasing the Q value. Since both the transversely and longitudinally coupled multi-mode filters operate on the same principle, only the transversely coupled multi-mode filter is described in further detail for avoiding redundancy.

The multi-mode type surface acoustic wave filter has a pass-band width which is generally represented by a fractional bandwidth ($\Delta f/f$), that is, the frequency difference $\Delta f$ between the resonance frequency frs of a symmetric mode and the resonance frequency fra of an anti-symmetric mode divided by the center frequency f. The frequency difference $\Delta f$ (=fra−frs) between the two modes has a certain value, and $\Delta f$ may be adjusted by the design of IDT electrodes or patterning of the reflectors, however, its upper and lower limits are determined by an electromechanical coupling factor $K^2$ of a piezoelectric substrate material.

Quartz crystal is often used as the piezoelectric substrate material. It has a factor $K^2$ of 0.14 to 0.16%. Then the fractional bandwidth ($\Delta f/f$) of conventional multi-mode type surface acoustic wave filters is limited to about 0.01 to 0.06% as shown in FIG. 8 of Japanese Patent Application Kokai (JP-A) No. 131213/1984. FIGS. 2(a), 2(b) and 2(c) are diagrams illustrating the filter characteristics, impedance characteristics of symmetric and antisymmetric modes, and Smith chart of a transversely coupled multi-mode filter having a fractional bandwidth ($\Delta f/f$) of 0.05%.

It is understood that the fractional bandwidth ($\Delta f/f$) of conventional multi-mode type surface acoustic wave filters has the limit of 0.06%. An attempt to forcibly expand the bandwidth of a multi-mode type surface acoustic wave filter beyond the capability of its substrate material, for example to increase the fractional bandwidth ($\Delta f/f$) to 0.1%, will result in filter characteristics as shown in FIG. 3(a) wherein a large ripple appears in the pass band, which is no longer regarded as a filter. The reason is given below. The difference between the anti-resonance frequency of a symmetric mode and the resonance frequency of an anti-symmetric mode is increased by forcible expansion of the bandwidth beyond the capability of substrate material as seen from the impedance characteristics of symmetric and antisymmetric modes shown in FIG. 3(b). Then the operating impedance of a filter within the pass-band becomes capacitive as shown in the Smith chart of FIG. 3(c), failing to achieve impedance matching with an external circuit and impedance matching between adjoining filters when a plurality of filters are connected in cascade, resulting in an increased insertion loss.

To overcome the above-mentioned problem associated with the expansion of the pass-band width of multi-mode type surface acoustic wave filters, a typical prior art approach uses a matching circuit for achieving impedance matching with an external circuit as shown in FIGS. 6 and 8. More particularly, matching circuits having sufficient inductances La, Lb and Lc to cancel the capacitive reactance of multi-mode type surface acoustic wave filters 1 are added to the connections between a plurality of multi-mode type surface acoustic wave filters 1 connected in cascade and the input and output terminals of multi-mode type surface acoustic wave filters. Actually, since the value of inductance L is several hundred nH in a frequency band of higher than 200 MHz and fine adjustment of the L value is difficult, it is a common practice to combine the inductance La given as a coil with a capacitor C to co-operatively cancel the capacitive reactance of multi-mode type surface acoustic wave filters.

In this case, however, a problem arises with respect to electrical characteristics. The above-mentioned impedance matching method ensures impedance matching in the pass-band, but from the aspect of filter characteristics in a wider band, the impedance matching behaves just like enhanced LC resonance so that the response of LC resonance is predominant among out-of-band characteristics, resulting in a deteriorated out-of-band attenuation. One countermeasure is to add resistance R parallel to L and C as shown in FIGS. 6 and 8 (a) to reduce the Q of LC resonance to increase the out-of-band attenuation, but is not so effective. In fact, a comparison of FIGS. 8(b) and 8(c) with FIG. 3(a) reveals that the out-of-band attenuation is deteriorated by about 20 dB when the impedance matching circuit is provided.

Also on use of the filter, such components as L, C, and R are necessary to provide impedance matching. This undesirably results in increase of the number of parts and fine adjustment is necessary at each impedance matching point.

These unfavorable things make the filter difficult to handle and utilize.

In the high frequency region, the out-of-band attenuation is largely affected by a stray capacitance component around a printed circuit board and the location of an inductance, capacitor and the like for impedance matching. The resulting out-of-band characteristics are unstable for practical use.

DISCLOSURE OF THE INVENTION

Therefore, an object of the present invention is to provide a surface acoustic wave device having improved filter characteristics including a greater fractional bandwidth ($\Delta f/f$) and a greater out-of-band attenuation.

Another object of the present invention is to provide a surface acoustic wave device having a filter portion and an impedance matching element built in a single package, thereby reducing the number of parts and eliminating fine adjustment of a matching circuit and the influence of peripheral circuits.

According to the present invention, there is provided a surface acoustic wave device comprising a plurality of surface acoustic wave filters connected in cascade, with an impedance matching element interposed between two adjoining surface acoustic wave filters. The impedance matching element is constructed by a surface acoustic wave resonator. Each filter has a pass band and includes a first piezoelectric substrate having a first electromechanical coupling factor. The resonator has an inductive band and includes a second piezoelectric substrate having a second electromechanical coupling factor. The second factor is greater than the first factor so that the inductive band of the resonator is wider than the pass band of the filter.

Preferably, each of the cascade-connected sections includes an equal plural number of parallel connected surface acoustic wave filters, with the impedance matching element in the form of a surface acoustic wave resonator interposed between two adjoining sections.

The surface acoustic wave filters and the surface acoustic wave resonator may be mounted in a single package.

Typically, the surface acoustic wave filters are multi-mode or transversal type surface acoustic wave filters.

Function

In the surface acoustic wave device of the construction that the electromechanical coupling factor of the piezoelectric substrate of a surface acoustic wave resonator is greater than that of a surface acoustic wave filter, the surface acoustic wave resonator exhibits inductive reactance range having a greater bandwidth than the pass-bandwidth of the surface acoustic wave filter as shown in FIG. 5. The impedance of the surface acoustic wave resonator becomes inductive with a phase of a 90° in a certain frequency band and capacitive with a phase of −90° in another frequency band. There is constructed an inductance having a limited frequency band. When a design is made such that the pass-band of the surface acoustic wave filter may coincide with the inductive band of the surface acoustic wave resonator, there can be achieved a combination that impedance matching is achieved by the inductance of the surface acoustic wave resonator only in the pass-band, but not in the attenuation band because of the capacitive impedance. This prevents deterioration of out-of-band characteristics by LC resonance as in the prior art and ensures an increased out-of-band attenuation.

By connecting the surface acoustic wave devices in parallel, the input impedance of filters can be reduced so that matching by impedance conversion is facilitated.

Since the surface acoustic wave resonator is prepared by the same process as the surface acoustic wave filters, a small-size impedance matching element can be easily fabricated. Since the surface acoustic wave filters and the surface acoustic wave resonator can be mounted in a single package, the device is easy to handle and little affected by peripheral circuits.

BEST MODE FOR CARRYING OUT THE INVENTION

Figure 7:
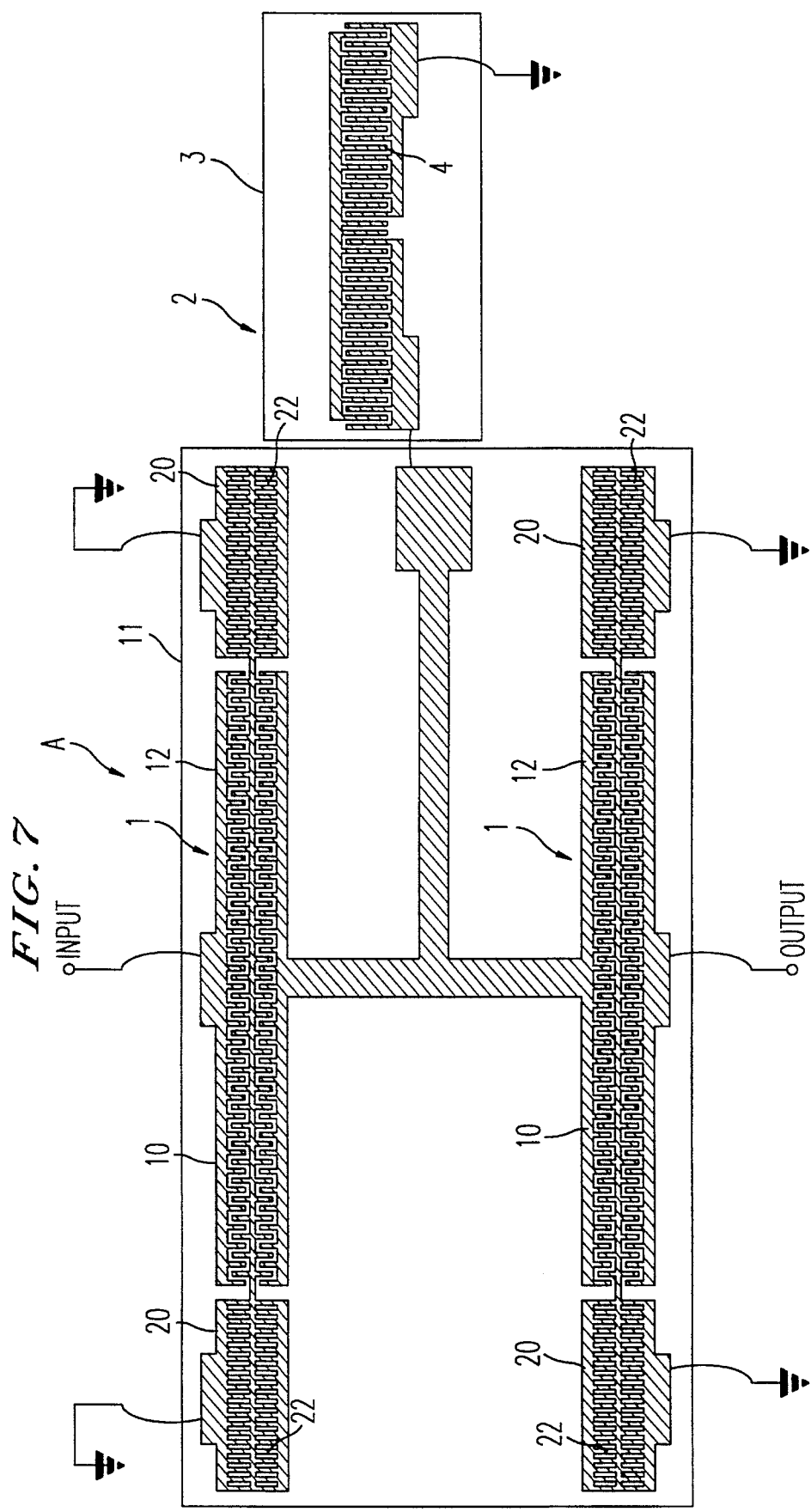
FIG. 7 is an exemplary pattern connection of a multi-mode filter according to the present invention.
Figure 8A:
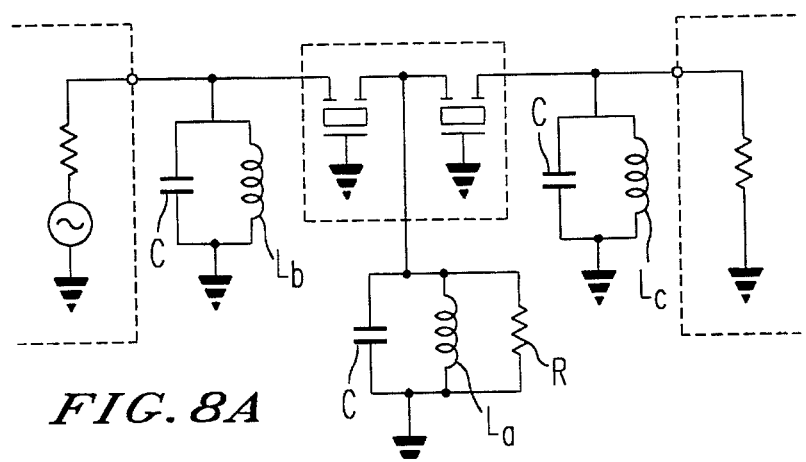
FIG. 8 illustrates filter characteristics with impedance matching according to the prior art.
Figure 8B:
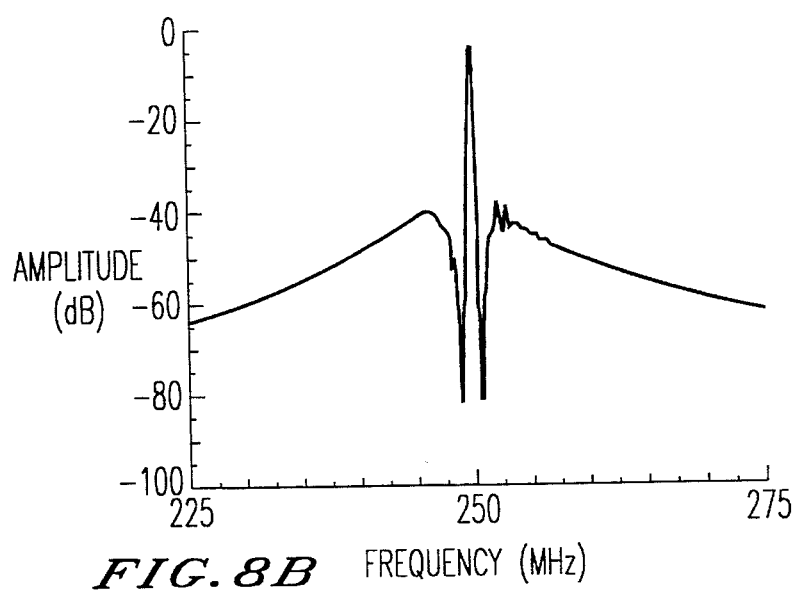
Figure 8C:
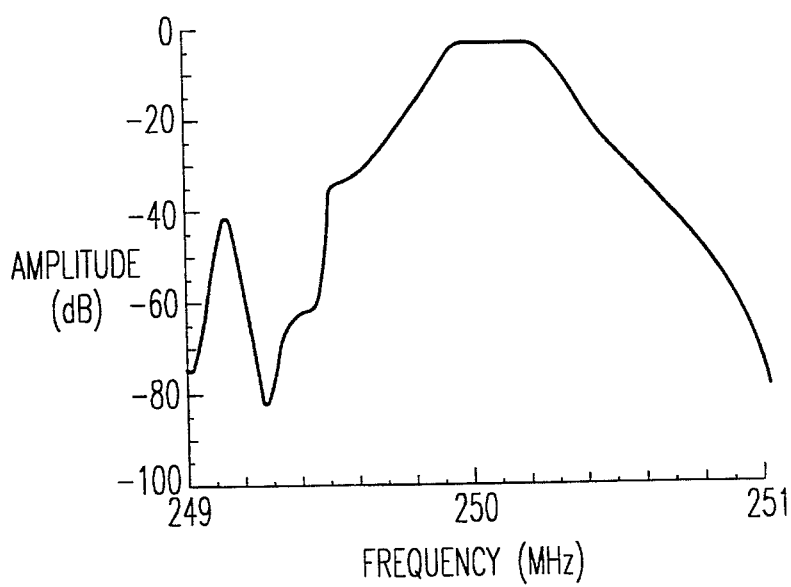
Figure 9A:
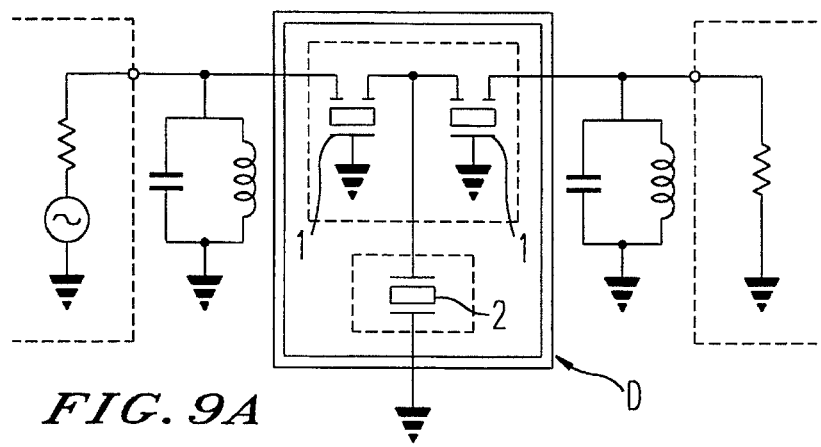
FIG. 9 illustrates filter characteristics with impedance matching by a surface acoustic wave resonator according to the present invention.
Figure 9B:
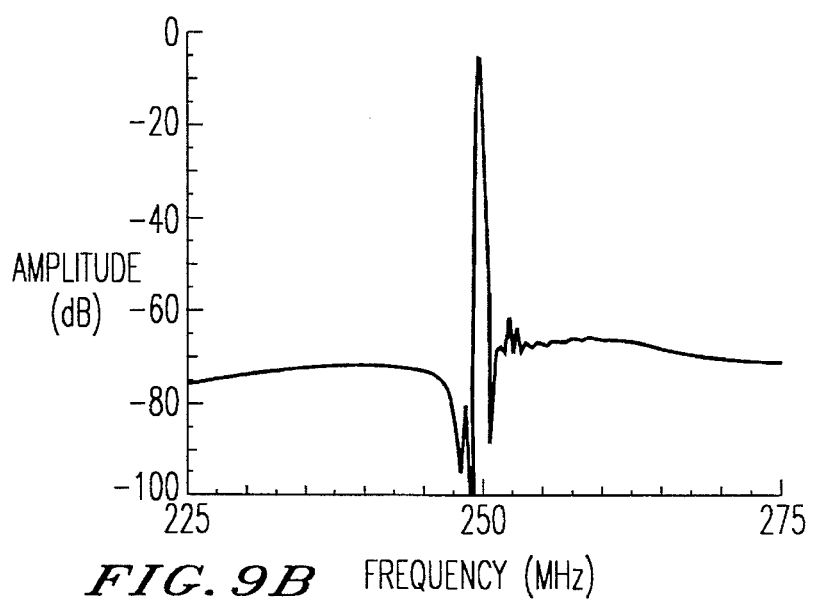
Figure 9C:
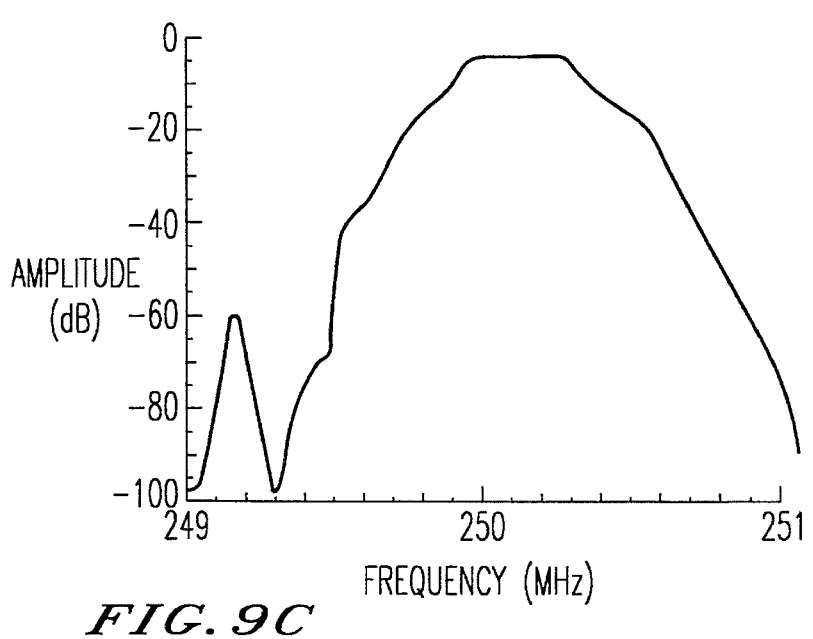

Referring to FIGS. 7 and 9, there is illustrated a surface acoustic wave device according to one embodiment of the present invention. The surface acoustic wave device A is used as a filter in a frequency band of about 70 to 400 MHz and includes a plurality of surface acoustic wave filters 1, which are typically multi-mode type surface acoustic wave filters, connected in cascade (two sections in the figures). An impedance matching element in the form of a surface acoustic wave resonator 2 is connected to the connection between two adjoining multi-mode type surface acoustic wave filters 1. It is understood that the surface acoustic wave filters used herein may be transversal type surface acoustic wave filters as well as multi-mode type surface acoustic wave filters.

The number of sections of connecting multi-mode type surface acoustic wave filters is at least two, preferably two or three. All these multi-mode type surface acoustic wave filters are of the same structure including an interdigital transducer (IDT) portion 10 and reflectors 20 disposed at opposite sides of the IDT portion 10. The IDT portion 10 includes a piezoelectric substrate 11 and IDT electrodes 12 formed and disposed on the substrate 11.

The piezoelectric substrate 11 used herein is generally an ST cut quartz crystal substrate having good temperature characteristics and a cut angle of about 30° to 43° which has an electromechanical coupling factor $K^2$ of about 0.14 to 0.16%. In addition to the quartz crystal, an X cut, 112° rotated, Y direction propagation LiTaO$_3$ substrate having a factor $K^2$ of 0.64% (to be referred to as X-112LT) is also a useful piezoelectric substrate. The material of which the electrodes are made may be any of metals and alloys which are well conductive, typically high purity aluminum and aluminum alloys having a minor amount of Cu or Ti added. The electrodes are generally formed by evaporation. Their thickness, which varies with the center frequency of filters, is preferably 2,000 to 5,000 Å in the case of 250 MHz band filters, for example. The reflectors 20 include a plurality of electrodes strips 22 formed and disposed on the piezoelectric substrate 11 common to the IDT portion 10.

Figure 12A:
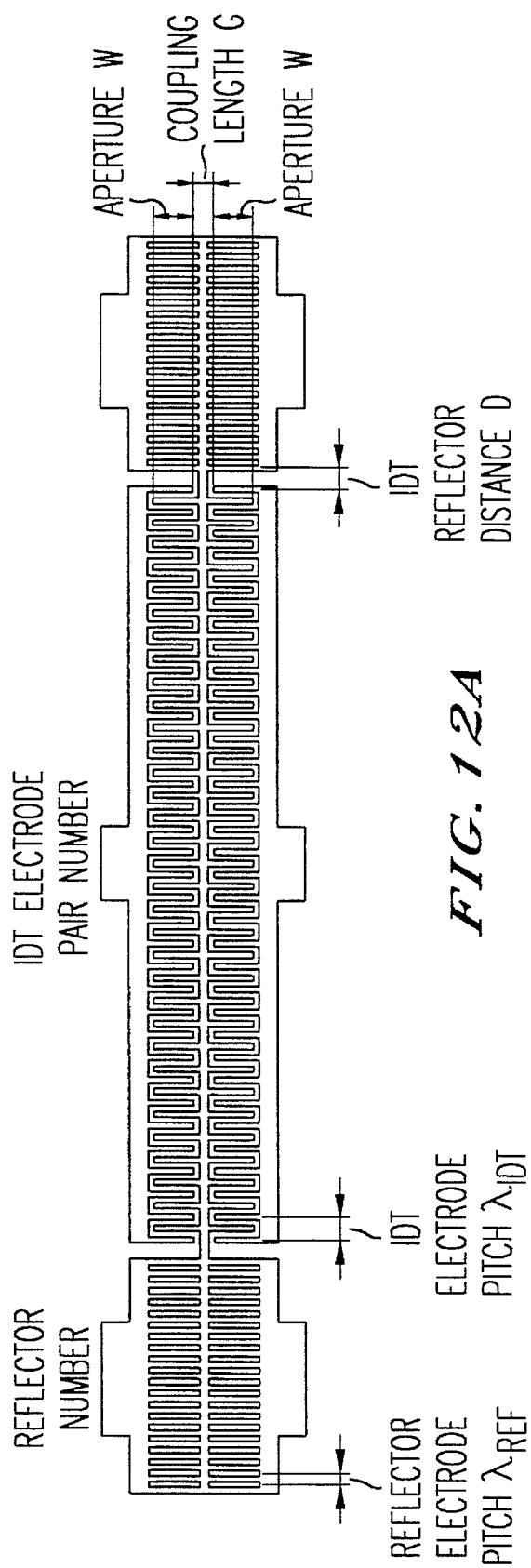
FIG. 12 schematically illustrates the structure of a surface acoustic wave device.

The center frequency of the multi-mode type surface acoustic wave filter is set within the above-mentioned range by adjusting mainly the number of IDT pairs, electrode pitch $\lambda_{IDT}$, aperture W, and coupling length G of the IDT electrodes 12 of the IDT portion 10, the number of electrodes and electrode pitch $\lambda_{REF}$ of the reflectors 20, and the distance D between the IDT electrode 12 and the reflector 20 as shown in FIG. 12(a) in a comprehensive manner, and the fractional bandwidth (Δf/f) thereof is adjusted to 0.06 to 0.15.

Figure 1A:
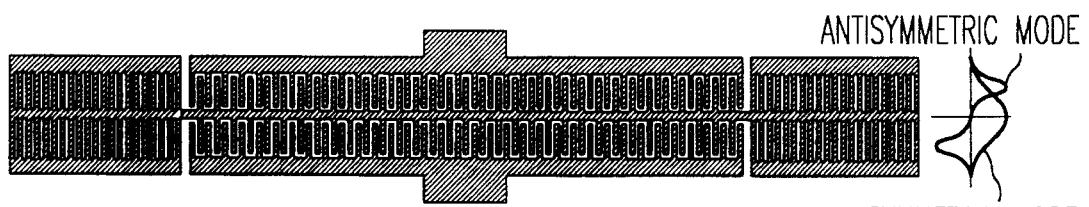
FIG. 1 illustrates the general pattern constructions of a surface acoustic wave filter.
Figure 1B:
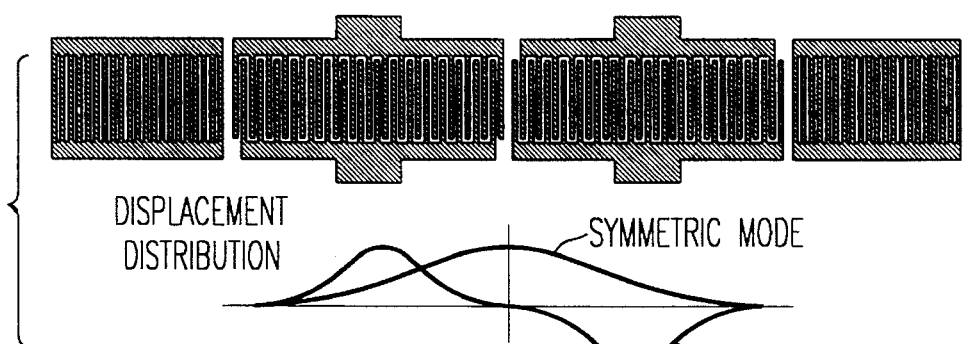
Figure 1C:
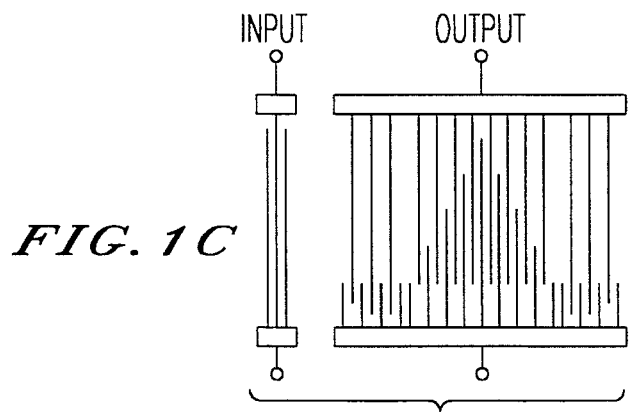
Figure 1D:
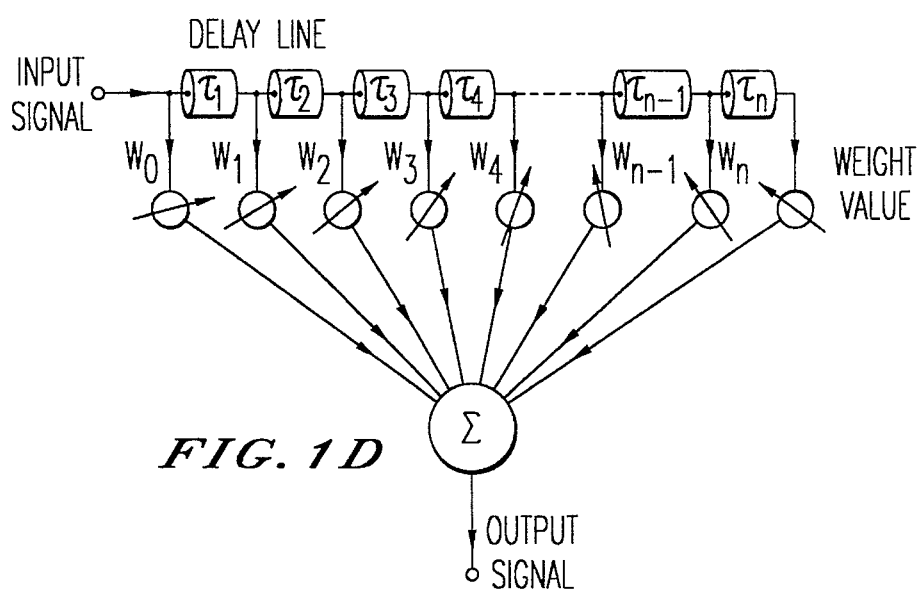
Figure 2A:
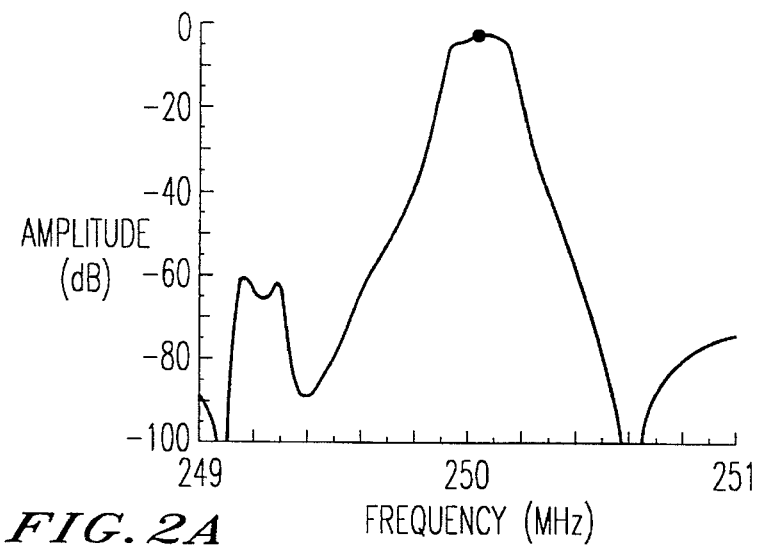
FIG. 2 illustrates characteristics of a prior art multi-mode filter having a fractional bandwidth of 0.05%.
Figure 2B:
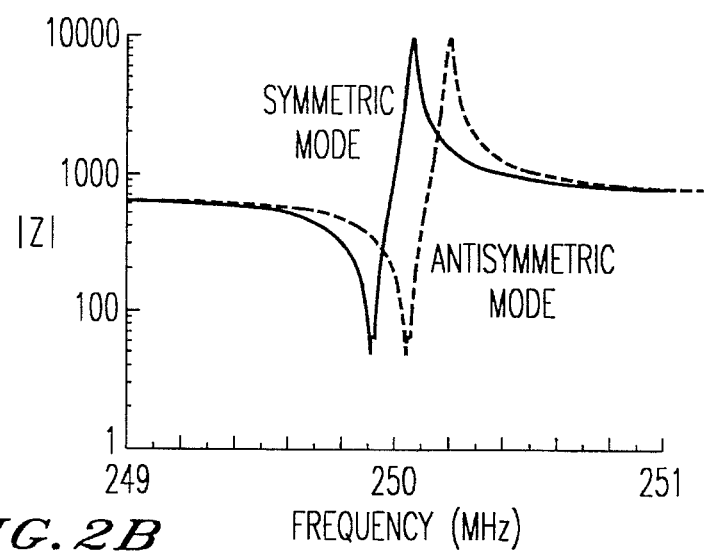
Figure 2C:
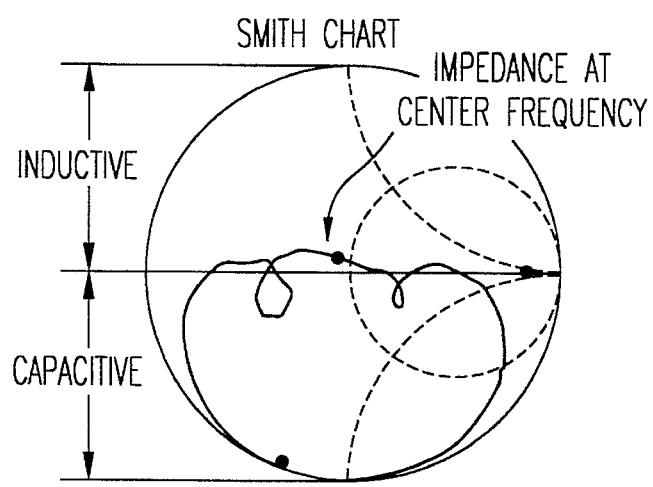
Figure 3A:
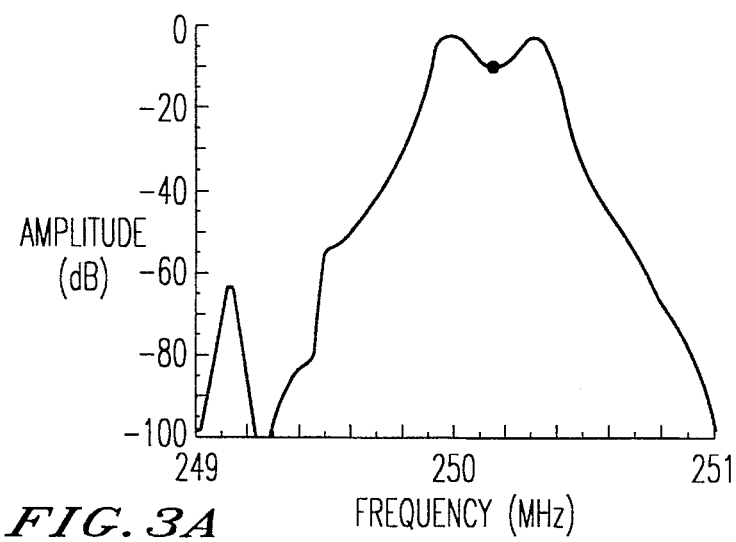
FIG. 3 illustrates characteristics of a prior art multi-mode filter having a fractional bandwidth of 0.1%.
Figure 3B:
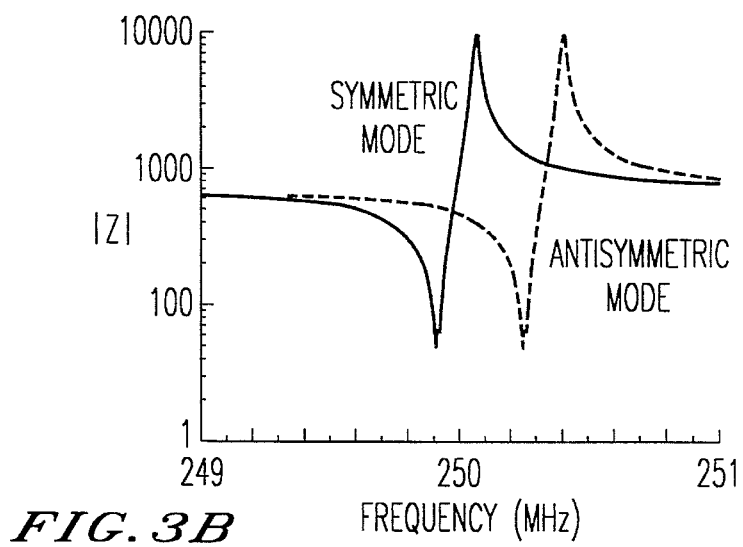
Figure 3C:
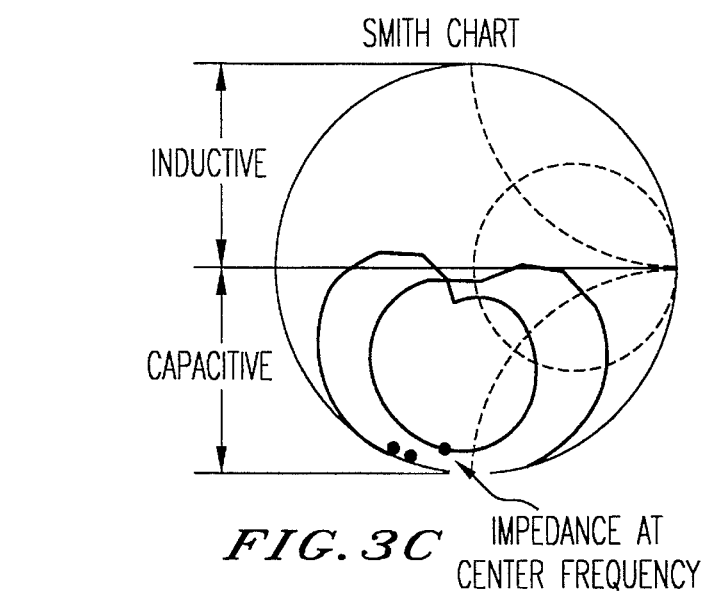

The transversal type surface acoustic wave filter as shown in FIG. 1(c) includes IDT electrodes on receiving and transmitting sides wherein the excitation intensity of respective electrode digits is weighted to provide filter performance. The IDT can be represented as in FIG. 1(d) when considered in a very weak electroacoustic coupling condition as a circuit having an input electric port and an output acoustic port or vice versa. The respective elements in FIG. 1(d) are explained using a delta function model. A weight function value $W_i$ corresponds to the intensity of an excitation source of each electrode, and a delay time $t_i$ is the time for a surface acoustic wave to propagate between a (i-1)-th excitation source and a i-th excitation source. The frequency response $H_\omega$ of this filter is represented by the following equation:

$$H(\omega) = Uout/Uin = \sum_{i=0}^{n} W_i \exp(-j\omega D i)$$

wherein $$D_i = \sum_{k=1}^{i} \tau k.$$

The transversal type surface acoustic wave filters of such construction also raise the same problem as the above-mentioned multi-mode type surface acoustic wave filters. The present invention is also effective for overcoming the problem associated with the transversal type surface acoustic wave filters.

Figure 4A:
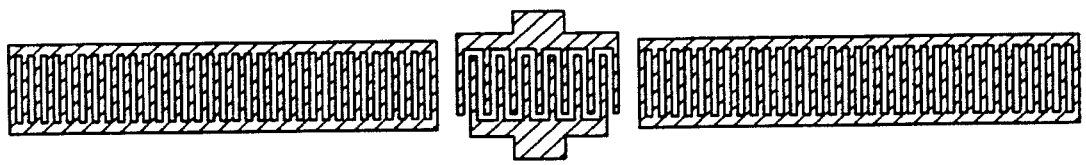
FIG. 4 illustrates the general pattern constructions of a surface acoustic wave resonator.
Figure 4B:
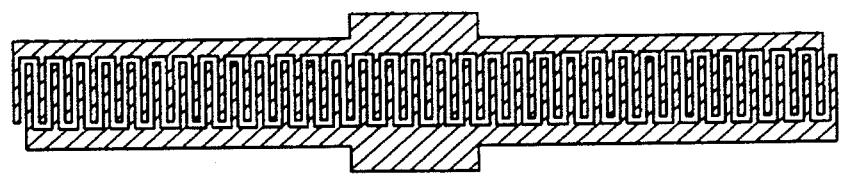
Figure 4C:
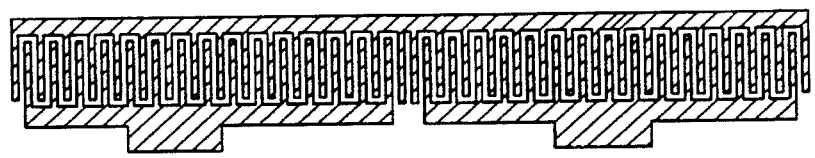

The surface acoustic wave resonator 2 used herein may be a cavity type surface acoustic wave resonator, IDT type surface acoustic wave resonator and folded transducer type surface acoustic wave resonator as shown in FIGS. 4(a), 4(b) and 4(c), respectively. The cavity type surface acoustic wave resonator of FIG. 4(a) includes reflectors on opposite sides of an IDT whereby surface waves radiating from the IDT are reflected by the reflectors to form a resonating cavity. The IDT type surface acoustic wave resonator of FIG. 4(b) is of the type wherein the number of electrodes in an IDT is increased so that resonance occurs by electrode reflection of the IDT itself. The folded transducer type surface acoustic wave resonator of FIG. 4(c) is of the type wherein impedance is increased by folding the IDT of the resonator of FIG. 4(a) or 4(b). FIG. 7 shows an embodiment using IDT type with folded transducer type surface acoustic wave resonators.

Figure 5A:
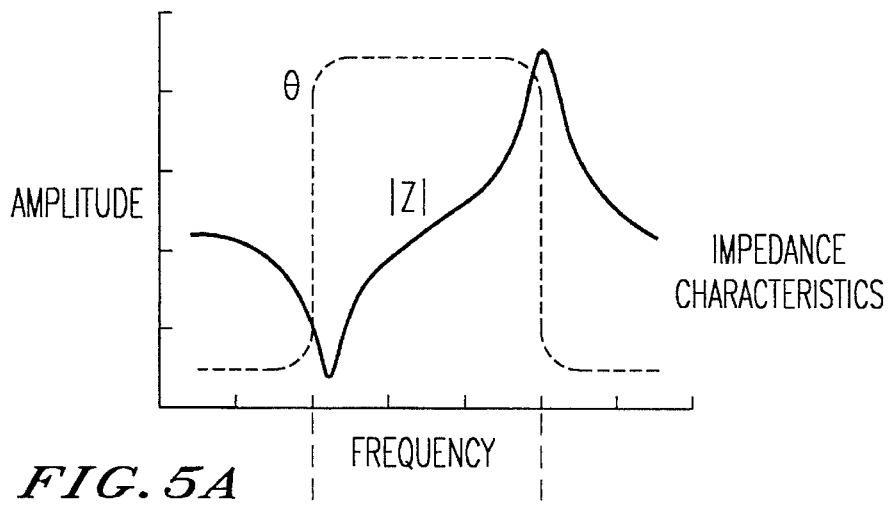
FIG. 5 illustrates the impedance and L-Q characteristics of a surface acoustic wave resonator and the frequency characteristics of a surface acoustic wave filter.
Figure 5B:
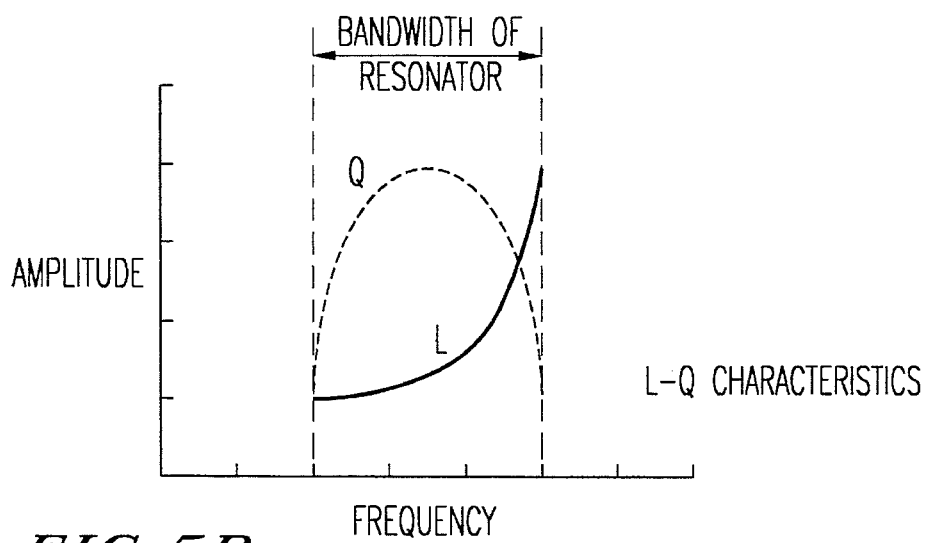
Figure 5C:
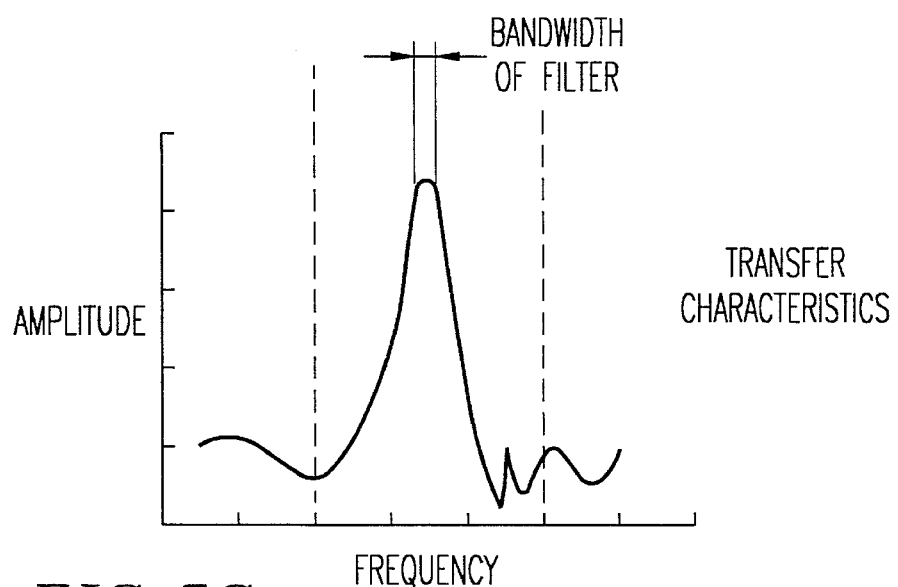

These surface acoustic wave resonators function as impedance matching elements utilizing the inductive band of their impedance characteristics as previously described in conjunction with FIG. 5. It is understood that in this disclosure, the width of the inductive band of the surface acoustic wave resonator is simply referred to as a bandwidth and the bandwidth divided by the center frequency is referred to as a resonator fractional bandwidth.

Like the IDT portion 10 of the above-mentioned multi-mode type surface acoustic wave filters, the surface acoustic wave resonator 2 includes a piezoelectric substrate 3 and IDT electrodes 4 formed and disposed on the substrate 3. The piezoelectric substrate 3 is formed of a material having a second electromechanical coupling factor $K^2$ which is greater than the first electromechanical coupling factor $K^2$ of the piezoelectric substrate 11 of the IDT portion 10. The second electromechanical coupling factor $K^2$ is preferably 2 to 15%. Useful examples are a 36° rotated Y cut X propagation LiTaO$_3$ substrate having a factor $K^2$ of 6.5% (to be referred to as 36LT), a 64° rotated Y cut X propagation LiNbO$_3$ substrate having a factor $K^2$ of 11.3% (to be referred to as 64LN), and a Y cut, 128° rotation, X propagation LiNbO$_3$ substrate having a factor $K^2$ of 5.5% (to be referred to as 128LN).

Figure 12B:
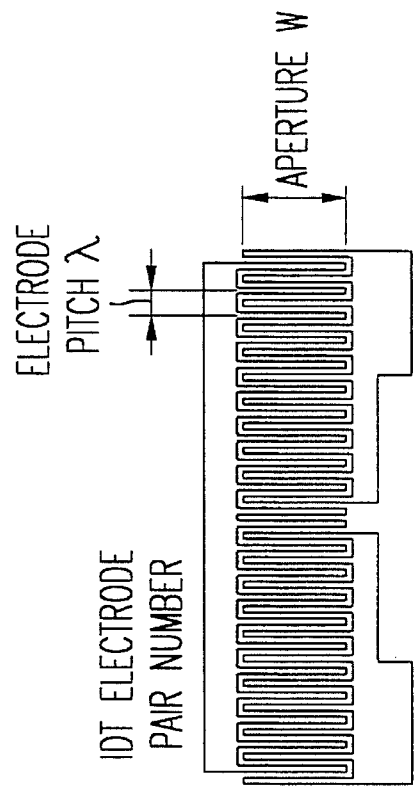
Figure 13A:
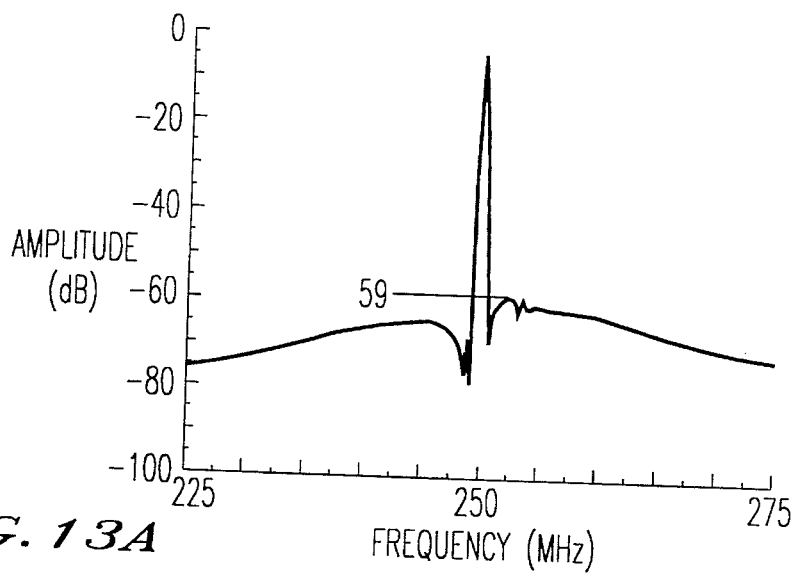
FIGS. 13, 14, 15, 17, 18, and 19 illustrate filter characteristics of surface acoustic wave devices of Example 1, 2, 3, 4, 5, and 6, respectively.
Figure 13B:
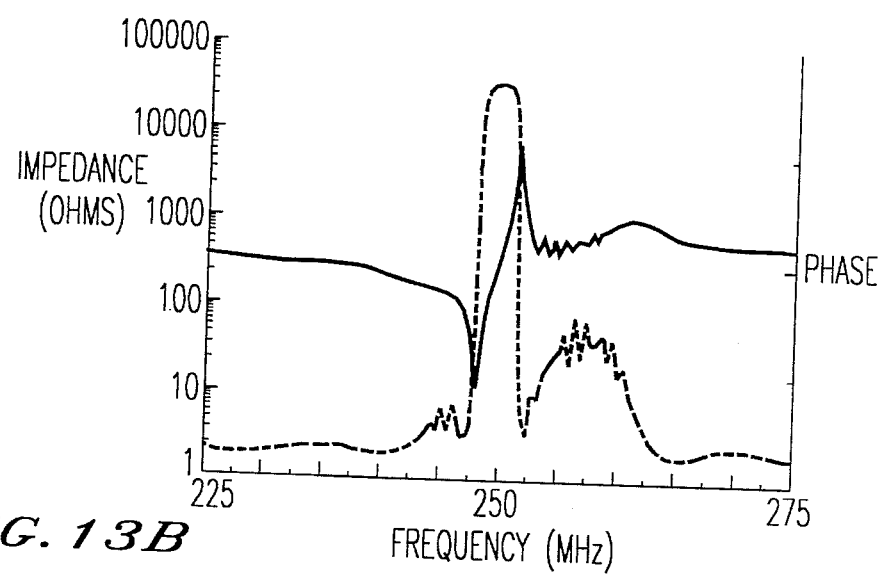
Figure 13C:
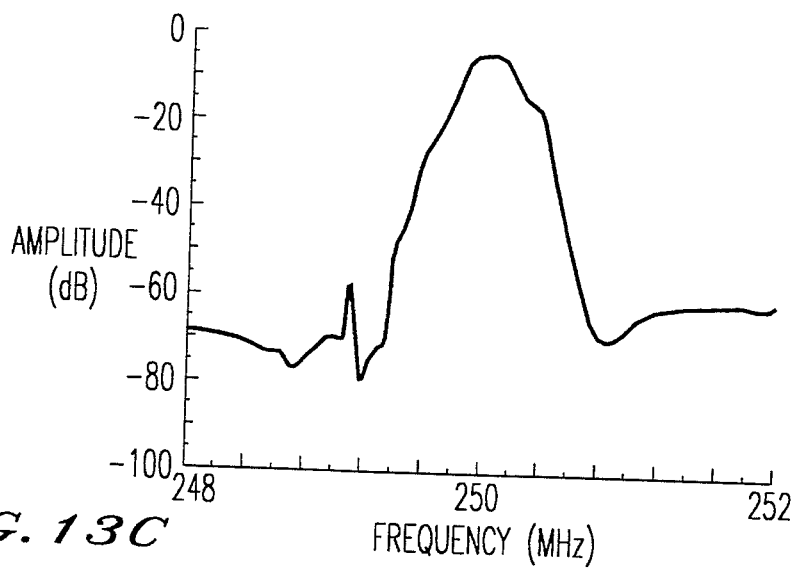
Figure 14A:
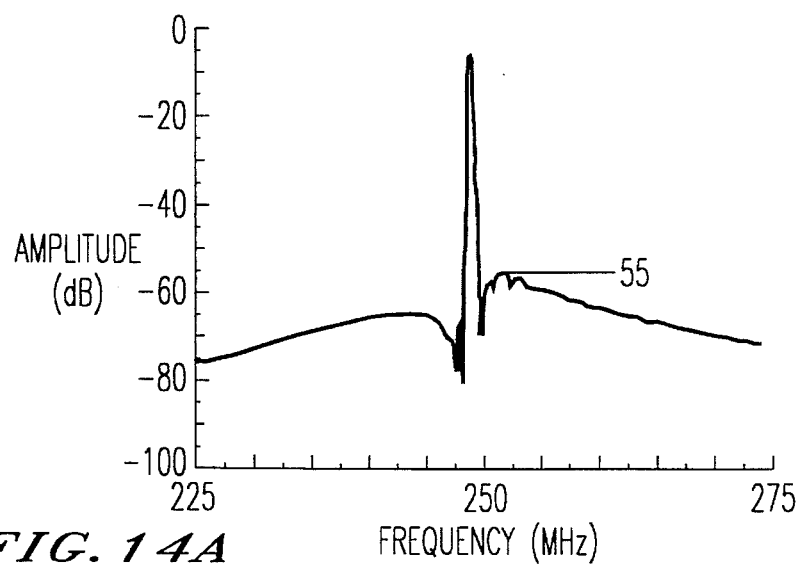
Figure 14B:
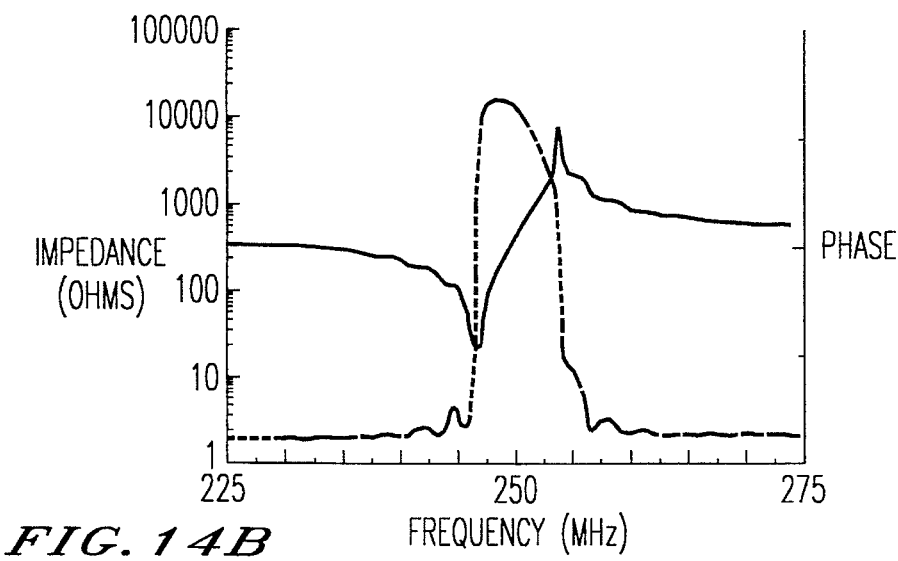
Figure 14C:
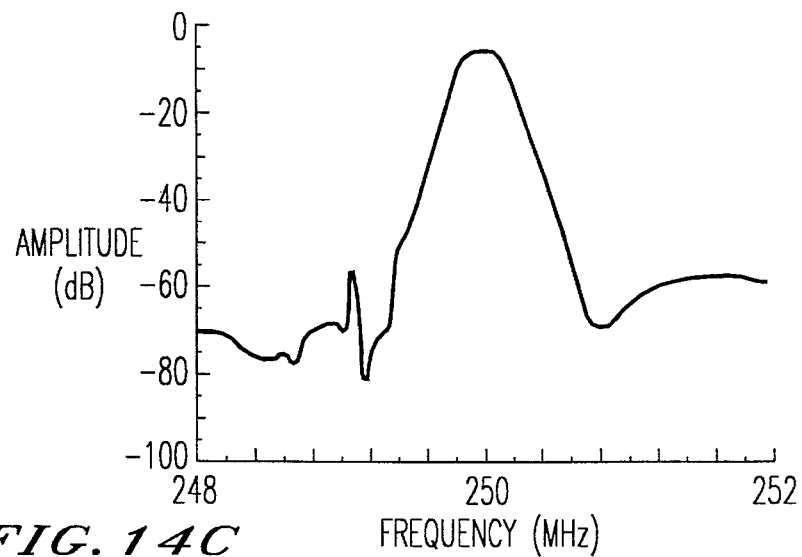
Figure 15A:
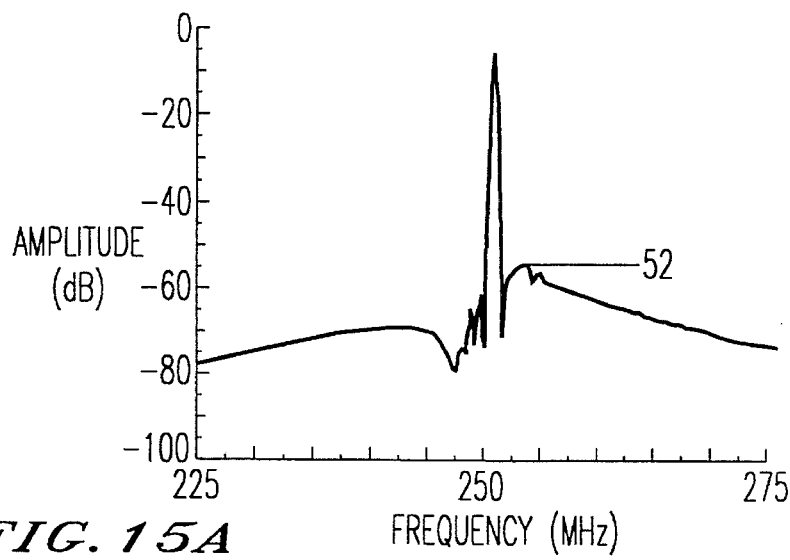
Figure 15B:
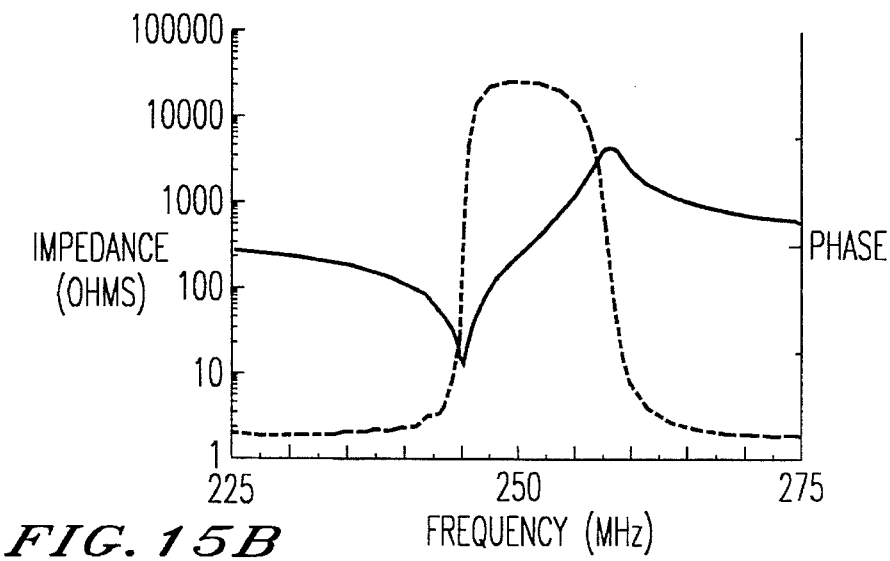
Figure 15C:
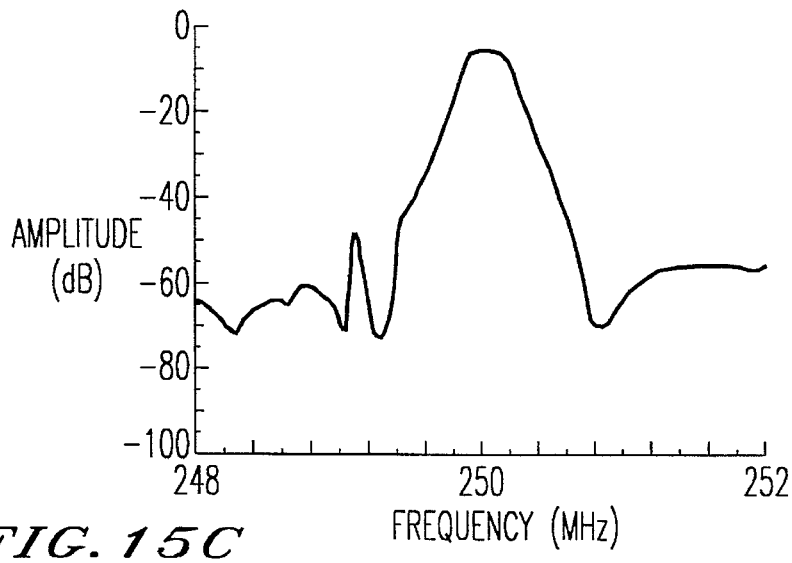
Figure 16A:
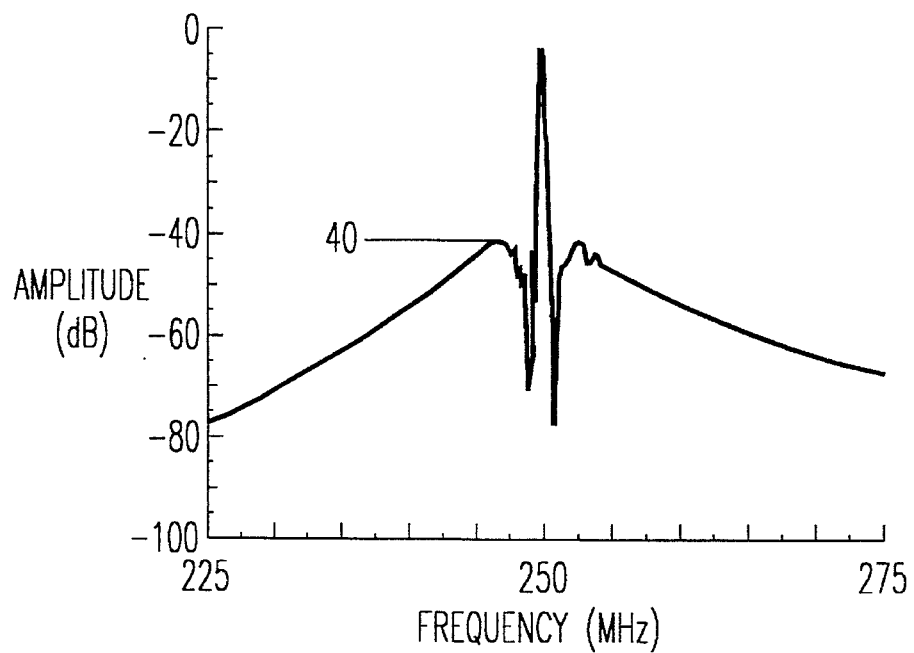
FIG. 16 illustrates filter characteristics of a surface acoustic wave device of Comparative Example.
Figure 16B:
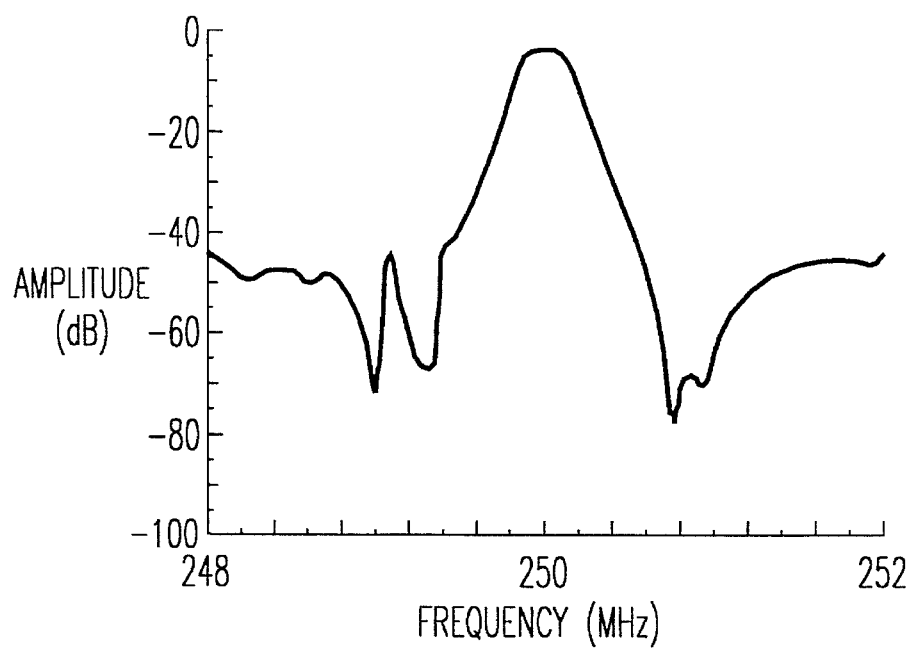

The resonator fractional bandwidth of the surface acoustic wave resonator is preferably 5 to 70 times, especially 10 to 50 times greater than the fractional bandwidth of the multi-mode type surface acoustic wave filters 1. For example, where a multi-mode type surface acoustic wave filter has a center frequency of 250 MHz, a pass-band width of 250 kHz and hence, a fractional bandwidth (Δf/f) of 0.1%, it is preferred that a surface acoustic wave resonator have a resonator fractional bandwidth of 0.5 to 7%, especially 1 to 5%. Consequently, the bandwidth of the surface acoustic wave resonator is preferably in the range of 1.25 to 17.5 MHz, especially 2.5 to 12.5 MHz. The bandwidth of the surface acoustic wave resonator is mainly decided by the electromechanical coupling factor $K^2$ of the piezoelectric substrate 3 and finely adjusted by comprehensively adjusting the IDT pair number, electrode pitch $\lambda_{IDT}$, aperture W and the like shown in FIG. 12(b). In an example wherein the center frequency is 250 MHz, the bandwidth of the surface acoustic wave resonator can be about 2 to 8 MHz when 36LT having $K^2$=6.5% is used, about 5 to 15 MHz when 64LN having $K^2$=11.3% is used, and about 1 to 6 MHz when 128LN having $K^2$=5.5% is used.

The resonator fractional bandwidth of the surface acoustic wave resonator is set as above because below the range, that is, with a narrower resonance bandwidth, the inductive L value playing the role of impedance matching has a steep frequency response to aggravate in-band characteristics of the filter whereas beyond the range, that is, a wider resonance bandwidth, the inductive band limiting effect is reduced to deteriorate the out-of-band attenuation.

Although the foregoing embodiment uses transversely coupled multi-mode filters, the present invention is also applicable to longitudinally coupled multi-mode filters insofar as the bandwidth is forcibly expanded so as to provide capacitive reactance in the pass-band. The present invention is also effective when a plurality of transversal type surface acoustic wave filters are connected in cascade because their input and output impedances are capacitive.

Although the cavity, IDT and folded transducer types are shown in FIG. 4 as typical examples of the surface acoustic wave resonator, it is desirable to use the cavity type for a relatively narrow bandwidth and the IDT type for a relatively wide bandwidth. It is to be noted that the resonator is sometimes folded transducer type for impedance matching with the filter. Especially desirable among these is the IDT type resonator which can have a wider resonator bandwidth. The reason is that although the L value of the resonator which is dependent on frequency as shown in FIG. 5 has the drawback that variations of the L value occur at the operating point, the increased resonator bandwidth reduces the frequency variation of the L value, resulting in less variations. For the same reason, the Q of the resonator should be as low as possible.

Figure 10:
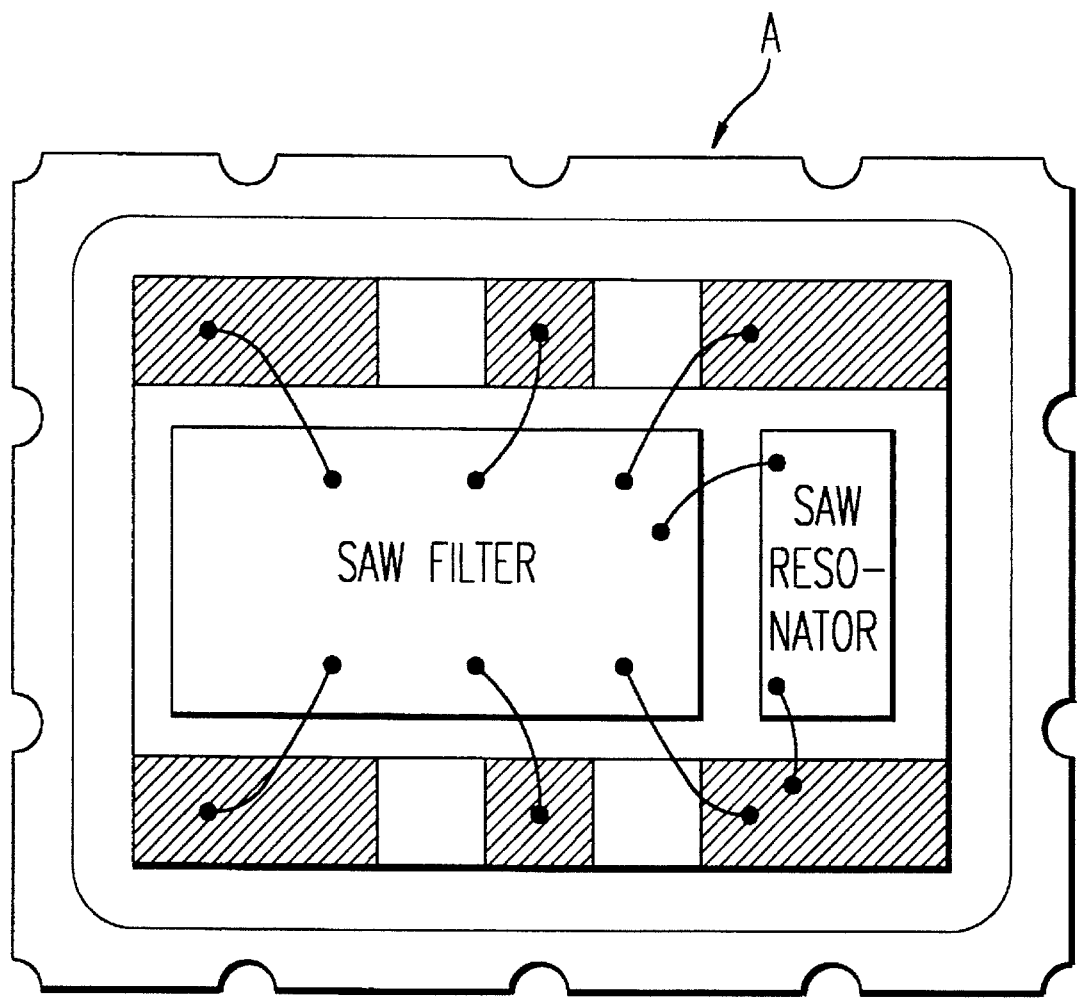
FIG. 10 illustrates the internal arrangement of a package according to the present invention.

The surface acoustic wave resonator can be prepared by the same process (photo lithographic process) as the surface acoustic wave filters, and is suitable for size reduction. The above-mentioned embodiment could be fabricated in a size of 2×1 mm. Therefore both a filter device and a matching resonator device can be placed in a single package. FIG. 10 schematically shows a surface acoustic wave (SAW) filter and a surface acoustic wave (SAW) resonator placed in a ceramic package. Since impedance matching is achieved within the single package, there is the advantage of maintaining an out-of-band attenuation stably without any influence from peripheral circuits and printed circuit board.

Figure 11A:
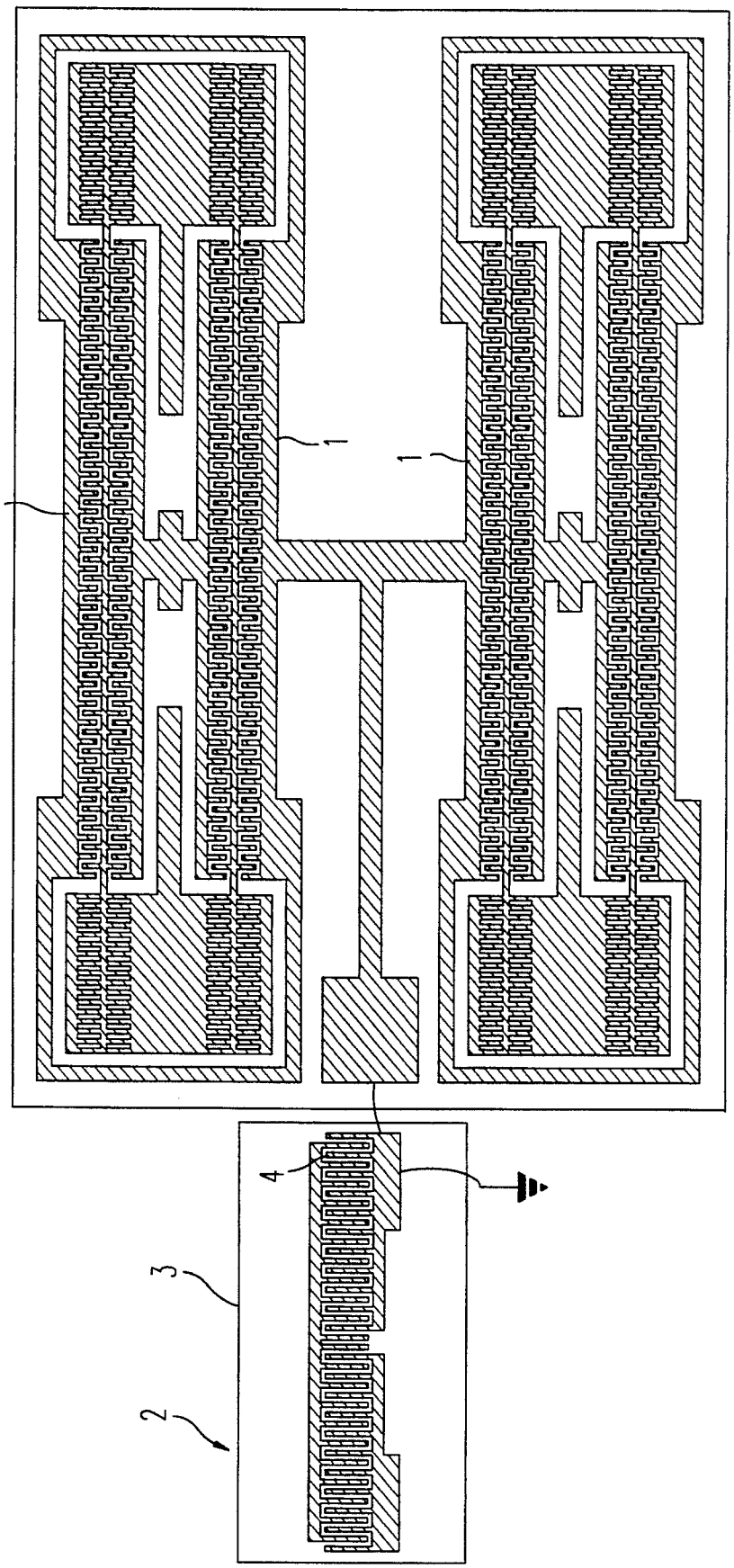
FIG. 11 illustrates one embodiment of the invention wherein impedance is reduced by parallel connection.
Figure 11B:
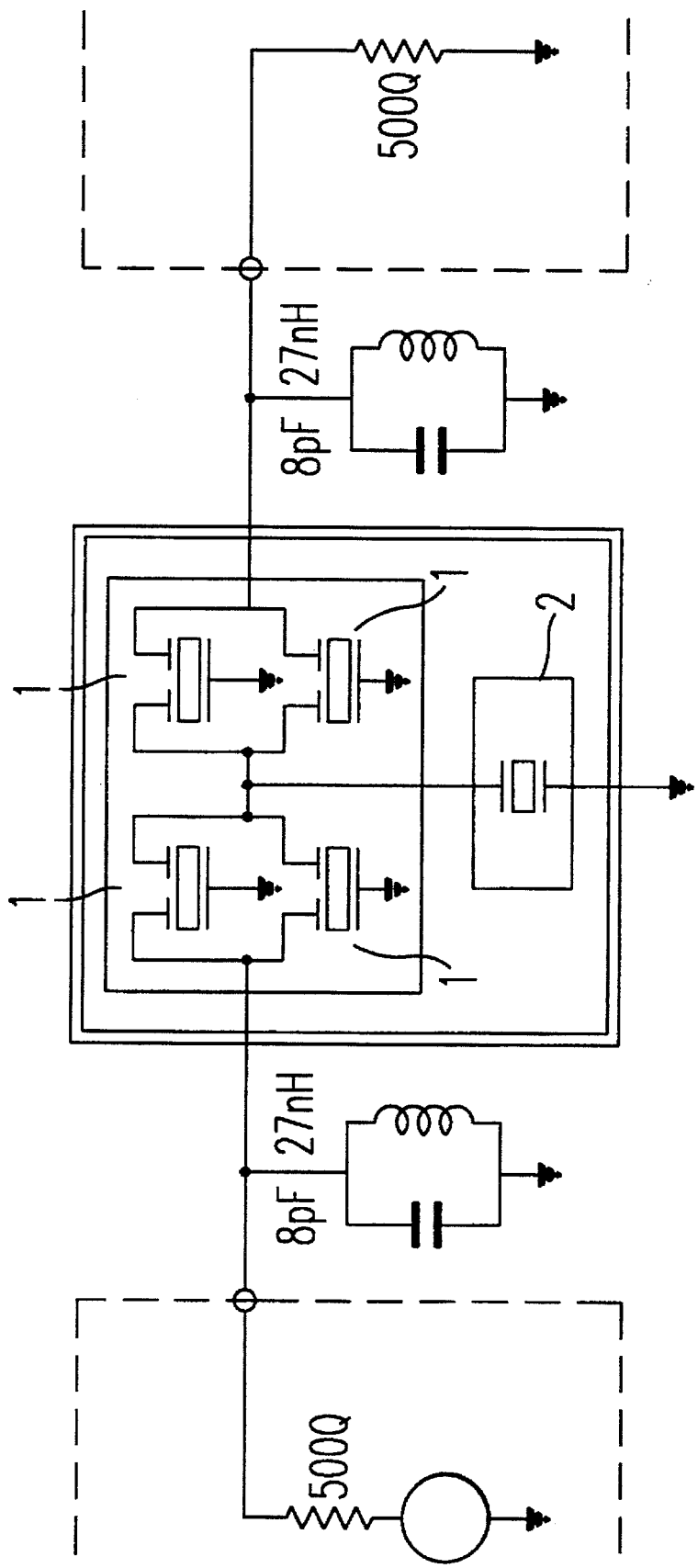

The surface acoustic wave device A of the construction shown in FIG. 7 wherein impedance matching is achieved by the surface acoustic wave resonator should preferably be of the arrangement having a plurality of parallel connected surface acoustic wave filters 1 in each section as shown in FIGS. 11(a) and 11(b). The number of surface acoustic wave filters is equal among the sections, generally two to five, preferably two or three. Then, when each section is constructed by two parallel-connected surface acoustic wave filters, the input impedance can be less than 500 Ω, that is, one-half as compared with the use of a single surface acoustic wave filter having an input impedance of 1,000 Ω. In the case of intermediate frequency for PHS (personal handy phone: Japanese digital cordless phone), this makes impedance matching easier at input/output port of the filter.

EXAMPLE

Examples of the present invention are given below by way of illustration and not by way of limitation.

EXAMPLES 1–3

By combining a multi-mode type surface acoustic wave filter having the structure and characteristics shown in Table 1 with three surface acoustic wave resonators having the structure and properties shown in Table 2, there were fabricated surface acoustic wave devices of Examples 1 to 3 having the structure shown in FIGS. 7 and 9.

TABLE 1

| IDT pair number | 280 pairs |
| --- | --- |
| Reflector strips number | 190 |
| IDT electrode pitch $\lambda_{IDT}$ | 12.54 µm |

TABLE 1-continued

| Reflector electrode pitch $\lambda_{REF}$ | 12.57 µm |
| --- | --- |
| IDT-reflector distance D | 0.45λ |
| Aperture W | 68 µm |
| Coupling length G | 1.0λ |
| Center frequency | 250 MHz |
| Pass-band width | 300 kHz |
| Fractional bandwidth Δf/f | 0.12 |
| Substrate | quartz crystal |
| $K^2$ | 0.14% |

TABLE 2

|  | Example 1 | Example 2 | Example 3 |
| --- | --- | --- | --- |
| Type | cavity | IDT folded | IDT folded |
| IDT pair number | 20 pairs | 80 pairs | 80 pairs |
| Electrode pitch $\lambda_{IDT}$ | 16.44 µm | 16.54 µm | 18.10 µm |
| Aperture W | 150 µm | 150 µm | 150 µm |
| Reflector strips number | 200 | none | none |
| Reflector pitch $\lambda_{REF}$ | 16.60 µm | — | — |
| Substrate | 36 LT | 36 LT | 64 LN |
| Bandwidth | 3 MHz | 7 MHz | 12 MHz |
| Resonator fractional bandwidth | 1.2% | 2.8% | 4.8% |
| $K^2$ | 6.5% | 6.5% | 11.3% |

Figure 6:
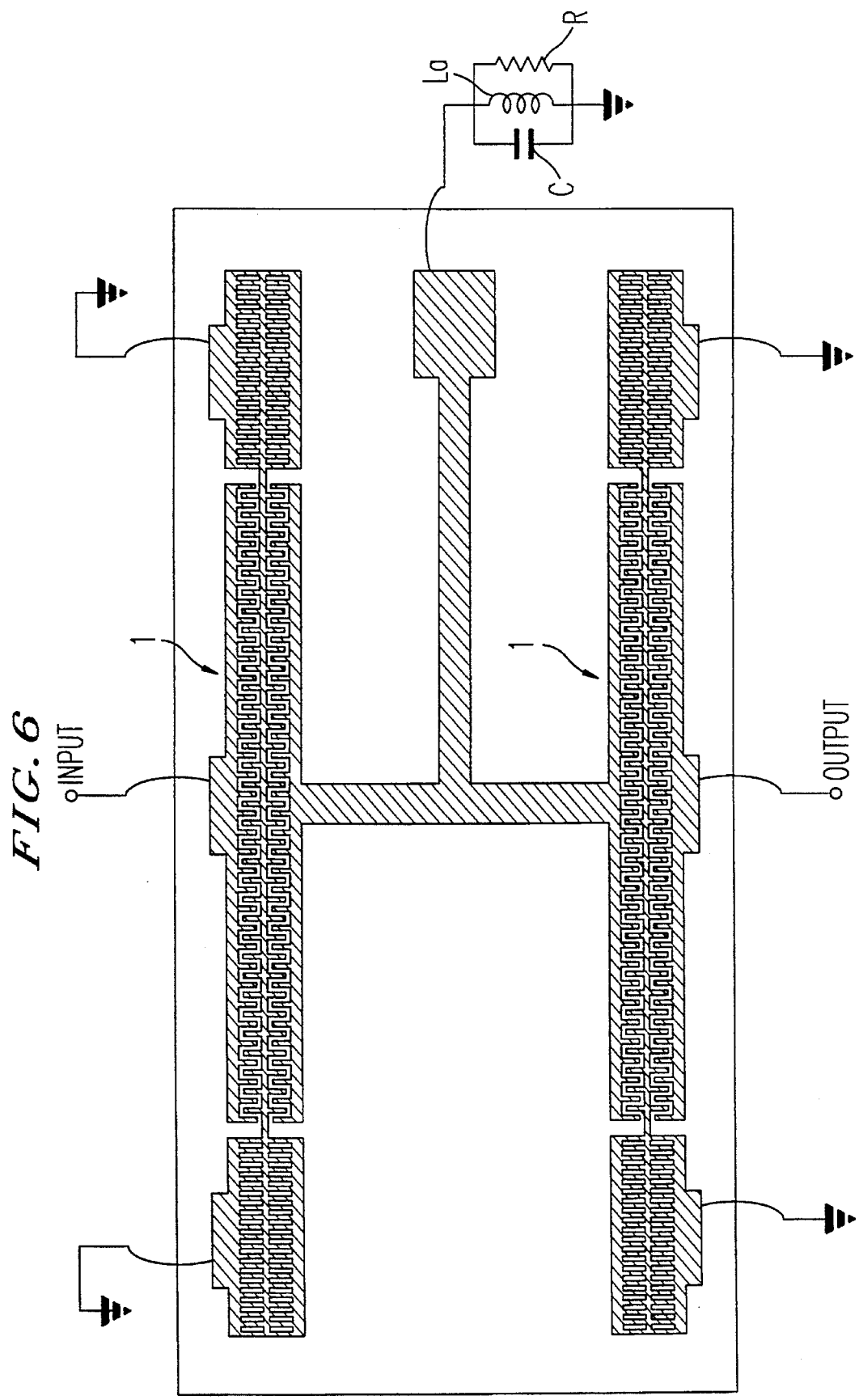
FIG. 6 is an exemplary pattern connection of a prior art multi-mode filter.

A surface acoustic wave device having the structure shown in FIG. 6 was fabricated as Comparative Example. The comparative surface acoustic wave device used an LC element as the impedance matching element as previously mentioned, in which the L element was a winding type L chip inductor having L=47 nH and Q=40 and the C element was a conventional chip capacitor having C=5 pF.

The surface acoustic wave devices of Examples 1 to 3 and Comparative Example were examined for filter performance. The results are shown in FIGS. 13, 14, 15, and 16. As seen from these diagrams, the surface acoustic wave devices of Examples 1 to 3 have an out-of-band attenuation which is improved by 12 to 19 dB over the surface acoustic wave device of Comparative Example.

EXAMPLES 4–6

By combining a multi-mode type surface acoustic wave filter having the structure and characteristics shown in Table 1 with three surface acoustic wave resonators having the structure and characteristics shown in Table 3, there were fabricated surface acoustic wave devices of Examples 4 to 6 having the structure shown in FIGS. 11(a) and 11 (b) that each section has a plurality of parallel connected surface acoustic wave filters.

TABLE 3

|  | Example 4 | Example 5 | Example 6 |
| --- | --- | --- | --- |
| Type | cavity | IDT folded | IDT folded |
| IDT pair number | 20 pairs | 80 pairs | 80 pairs |
| Electrode pitch $\lambda_{IDT}$ | 16.44 µm | 16.54 µm | 18.10 µm |
| Aperture W | 300 µm | 300 µm | 300 µm |
| Reflector strips number | 200 | none | none |
| Reflector pitch $\lambda_{REF}$ | 16.60 µm | — | — |
| Substrate | 36 LT | 36 LT | 64 LN |
| Bandwidth | 3 MHz | 7 MHz | 12 MHz |
| Resonator fractional bandwidth | 1.2% | 2.8% | 4.8% |
| $K^2$ | 6.5% | 6.5% | 11.3% |

Figure 17A:
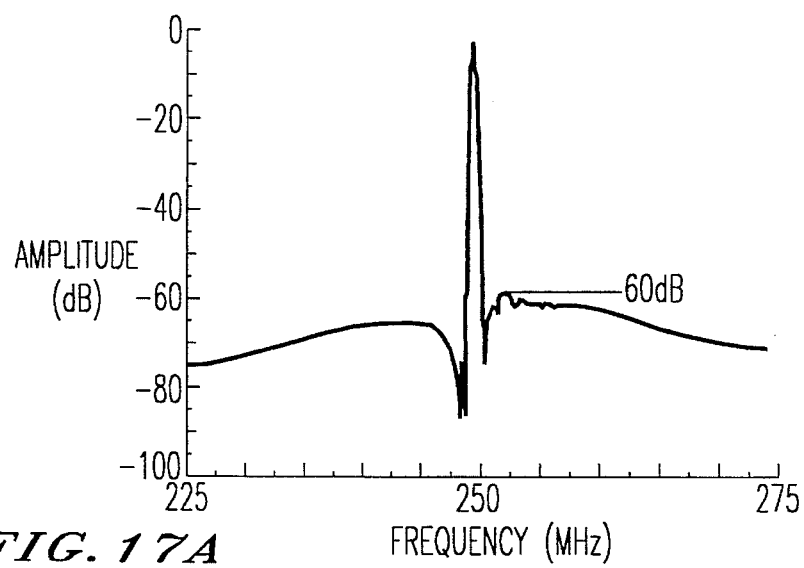
Figure 17B:
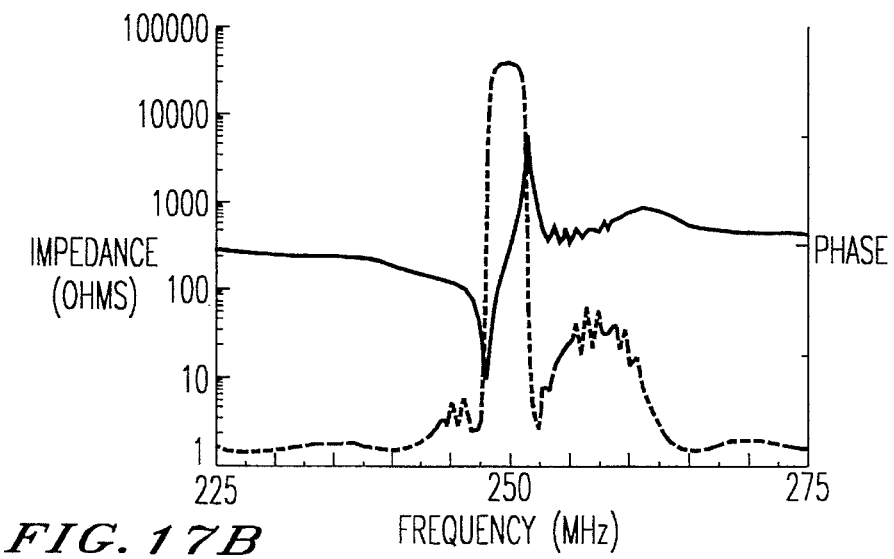
Figure 17C:
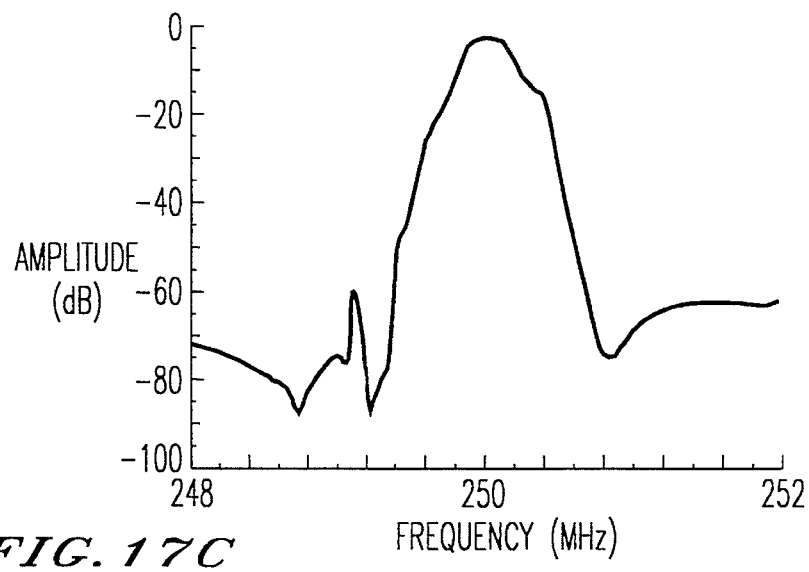
Figure 18A:
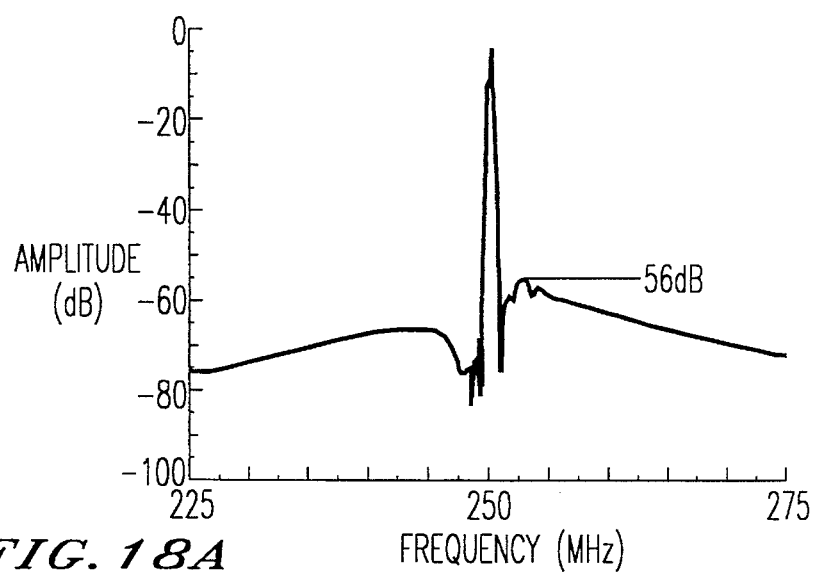
Figure 18B:
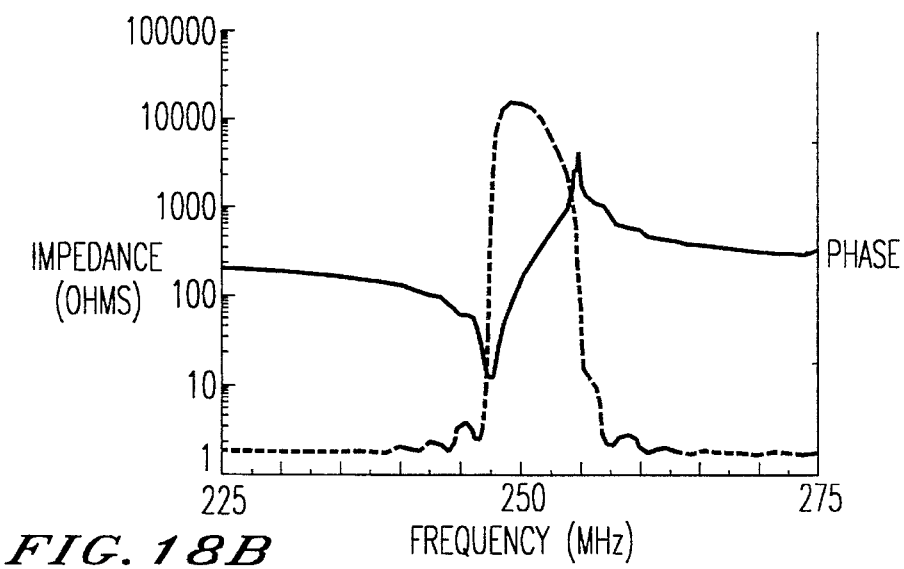
Figure 18C:
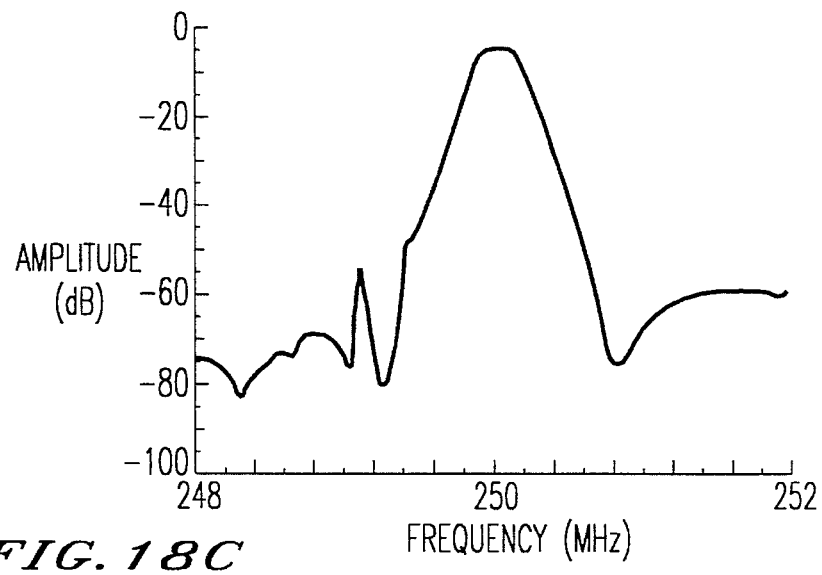
Figure 19A:
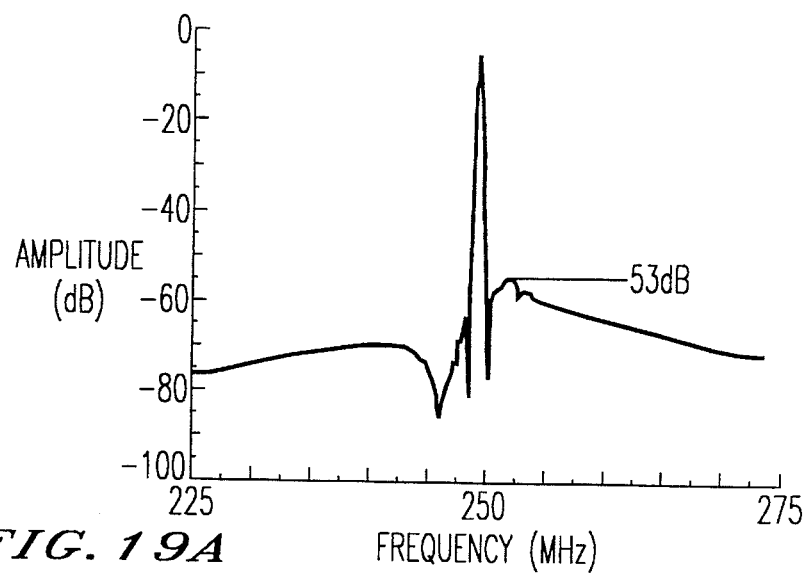
Figure 19B:
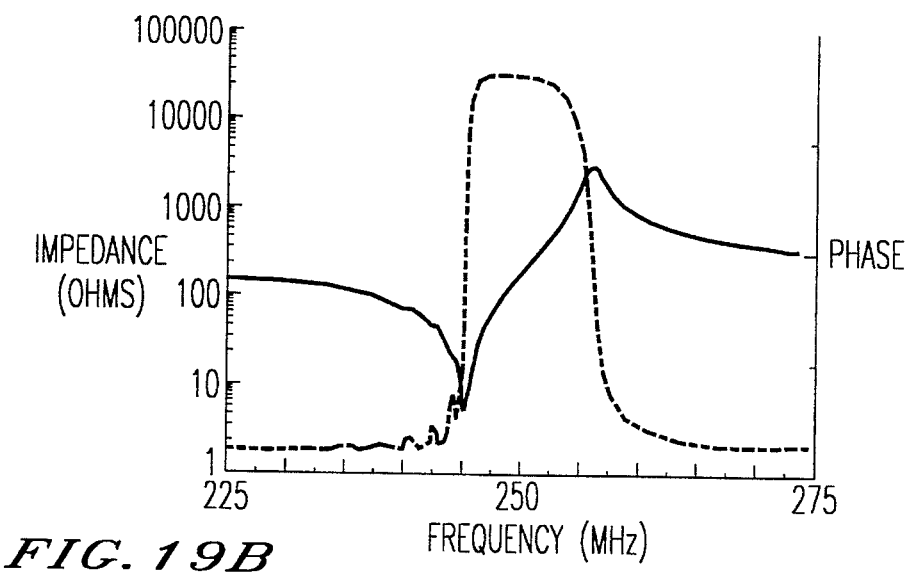
Figure 19C:
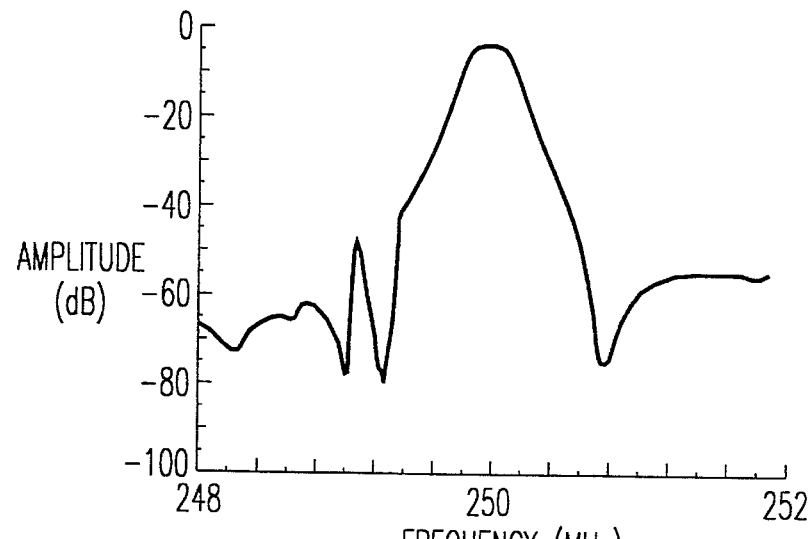

The surface acoustic wave devices of Examples 4 to 6 were examined for filter performance. The results are shown in FIGS. 17, 18, and 19. As seen from these diagrams, the surface acoustic wave devices of Examples 4 to 6 have characteristics at least comparable to those of Examples 1 to 3. Although the surface acoustic wave devices of Examples 1 to 3 had an input/output impedance of 1,000 Ω, the surface acoustic wave devices of Examples 4 to 6 had a input/output impedance of 500 Ω or one-half of the former.

Although quartz crystal substrates were used to form surface acoustic wave filters in the Examples, equivalent results were obtained when other materials such as X-112LT were used. Although multi-mode type surface acoustic wave filters were used as the surface acoustic wave filters in the Examples, the use of transversal type surface acoustic wave filters gave equivalent results and achieved an out-of-band attenuation improvement of more than 10 dB over the use of the LC element.

Because of the above-mentioned construction, the surface acoustic wave device of the invention provides for an out-of-band attenuation which is about 10 to 20 dB improved over the conventional surface acoustic wave filters. Because of ease of fabrication and a size reduction of a matching element, there can be obtained a surface acoustic wave device having a matching element built therein. This eliminates a need for components L, C and R which are necessary for impedance matching at the connection between two elements in the prior art.

Japanese Patent Application No. 211796/1994 is incorporated herein by reference.

While the invention has been described in connection with what is presently considered to be the most practical and preferred embodiment, it will be understood that the invention is not to be limited to the disclosed embodiment, but on the contrary, is intended to cover various modifications and equivalent arrangements included within the spirit and scope of the appended claims.

We claim:

1. A surface acoustic wave device comprising: a plurality of surface acoustic wave filters connected in cascade, with an impedance matching element interposed between two adjoining surface acoustic wave filters, wherein said impedance matching element is constructed by a surface acoustic wave resonator, each said filter has a pass band and includes a first piezoelectric substrate having a first electromechanical coupling factor, said resonator has an inductive band and includes a second piezoelectric substrate having a second electromechanical coupling factor, and the second factor is greater than the first factor so that the inductive band of said resonator is wider than the pass band of said filter.

2. The surface acoustic wave device of claim 1 wherein each of said cascade-connected sections includes an equal plural number of parallel connected surface acoustic wave filters, with the impedance matching element in the form of a surface acoustic wave resonator interposed between two adjoining sections.

3. The surface acoustic wave device of claim 1 wherein said surface acoustic wave filters and said surface acoustic wave resonator are mounted in a single package.

4. The surface acoustic wave device of claim 1 wherein said surface acoustic wave filters are multi-mode type surface acoustic wave filters.

5. The surface acoustic wave device of claim 1 wherein said surface acoustic wave filters are transversal type surface acoustic wave filters.

* * * * *